(12) United States Patent
Koleszar

(10) Patent No.: US 8,668,175 B2  
(45) Date of Patent: Mar. 11, 2014

(54) ELECTRONICS CABINET BRACKET SYSTEM

(76) Inventor: Nathan J. Koleszar, Rome, OH (US)

( * ) Notice: Subject to any disclaimer, the term of this patent is extended or adjusted under 35 U.S.C. 154(b) by 0 days.

(21) Appl. No.: 13/419,059

(22) Filed: Mar. 13, 2012

(65) Prior Publication Data

US 2013/0240691 A1   Sep. 19, 2013

(51) Int. Cl.
| | |
|---|---|
| A47B 96/06 | (2006.01) |
| A47G 29/00 | (2006.01) |
| A47K 1/00 | (2006.01) |
| E04G 3/00 | (2006.01) |
| E04G 5/06 | (2006.01) |
| F21V 21/00 | (2006.01) |
| F21V 35/00 | (2006.01) |

(52) U.S. Cl.
USPC .................. 248/219.1; 248/218.4; 248/122.1; 248/125.1; 312/245; 312/247; 108/106; 108/152; 108/160

(58) Field of Classification Search
USPC ........ 248/218.4, 219.1, 219.2, 227.3, 220.21, 248/229.1, 219.3, 122.1, 121, 124.1, 125.1, 248/201; 182/187, 188, 133, 135; 232/39; 40/607.09, 607.1, 607.12, 607.01; 312/198, 245–247, 351; 108/106–108, 108/147.15, 152, 160, 134, 135
See application file for complete search history.

(56) References Cited

U.S. PATENT DOCUMENTS

| | | | | |
|---|---|---|---|---|
| 847,728 | A * | 3/1907 | Caldwell | 378/181 |
| 1,001,535 | A * | 8/1911 | La Kamp | 81/3.32 |
| 1,002,260 | A * | 9/1911 | Golden | 246/477 |
| 2,550,338 | A * | 4/1951 | Dunagan | 248/145 |
| 2,919,873 | A * | 1/1960 | Tice | 248/476 |
| 3,231,230 | A * | 1/1966 | Mueller | 248/449 |
| 5,340,069 | A * | 8/1994 | Niemeyer | 248/214 |
| 5,360,191 | A * | 11/1994 | Carson et al. | 248/218.4 |
| 5,463,973 | A * | 11/1995 | Tait | 116/173 |
| 5,683,066 | A * | 11/1997 | McCann | 248/295.11 |
| 5,944,896 | A * | 8/1999 | Landesman et al. | 118/500 |
| 5,964,444 | A * | 10/1999 | Guertler | 248/548 |
| 6,969,034 | B2 * | 11/2005 | Ware et al. | 248/218.4 |
| 7,036,632 | B1 * | 5/2006 | Price | 182/187 |
| 7,195,213 | B2 * | 3/2007 | Weatherly | 248/125.1 |
| 7,316,376 | B1 * | 1/2008 | Engler | 248/218.4 |
| 8,061,665 | B2 * | 11/2011 | Solis et al. | 248/219.1 |
| 8,251,324 | B2 * | 8/2012 | Patterson et al. | 248/218.4 |
| 2007/0017744 | A1 * | 1/2007 | Jacks | 182/187 |
| 2010/0071993 | A2 * | 3/2010 | Wydner et al. | 182/3 |

* cited by examiner

*Primary Examiner* — Nkeisha Smith  
(74) *Attorney, Agent, or Firm* — Howard M. Cohn

(57) ABSTRACT

A cabinet bracket system is secured to a column for supporting an electronics cabinet. The cabinet bracket system includes a lower cabinet bracket disposed against the bottom of the electronics cabinet, an upper cabinet bracket disposed against the top of the electronics cabinet, and a bottom support bracket secured to the lower cabinet bracket so as to prevent lower bracket from moving on the column when the electronics cabinet is mounted onto the lower cabinet bracket.

17 Claims, 4 Drawing Sheets

ELECTRONICS CABINET BRACKET SYSTEM

TECHNICAL FIELD OF THE INVENTION

The present invention relates to a cabinet bracket system for supporting an electronics cabinet and more particularly to a cabinet bracket system for supporting an electronics cabinet that is secured to a column.

BACKGROUND OF THE INVENTION

Computers utilized as servers and related equipment, such as disk drive arrays, networking equipment, tape backup drives, power supplies, etc. are generally housed in computer related equipment cabinets. The equipment cabinet itself is a relatively simple structure that resembles an open-frame cabinet without shelves. Computer server/component racks are typically constructed with hinged front-doors, rigid sides and a rear panel (which is either hinged or removable, allowing it to be swung out of the way, or removed when access from the rear is desired). Within the "shell" formed by the sides (and the front and rear doors) is a structural frame. The cabinet frame is capable of supporting the weight of the equipment contained within the cabinet and serves as the primary means of securing components therein. The cabinet frame closely resembles an industrial shelving unit and typically includes four rigid corner posts connected to each other with a number of cross members and structural supports. Each of the four corner posts include mounting rails, with holes at regular spacings, which enable the electronic packages to be affixed to the equipment rack, typically with screws.

Computer related equipment cabinets are typically utilized in commercial settings, such as in large box stores. However, the computer related cabinets are bulky and cumbersome, and must be placed so as not to interfere with shoppers.

SUMMARY OF THE INVENTION

According to an embodiment of the present invention, a cabinet bracket system is secured to a column for supporting an electronics cabinet. The cabinet bracket system includes a lower cabinet bracket disposed against the bottom of the electronics cabinet, an upper cabinet bracket disposed against the top of the electronics cabinet, and a bottom support bracket secured to the lower cabinet bracket so as to prevent lower bracket from moving on the column when the electronics cabinet is mounted onto the lower cabinet bracket.

According to another embodiment of the present invention, a method of supporting an electronics cabinet on a column. The method includes mounting a lower cabinet bracket to the column, disposing the bottom of the electronics cabinet on the lower cabinet bracket, mounting an upper cabinet bracket to the column at a location above the top of the electronics cabinet, and lowering the upper cabinet bracket to engage the top surface of the electronics cabinet.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

In the drawings accompanying the description that follows, both reference numerals and legends (labels, text descriptions) may be used to identify elements. If legends are provided, they are intended merely as an aid to the reader, and should not in any way be interpreted as limiting.

DETAILED DESCRIPTION OF THE PREFERRED EMBODIMENTS

Figure 1:
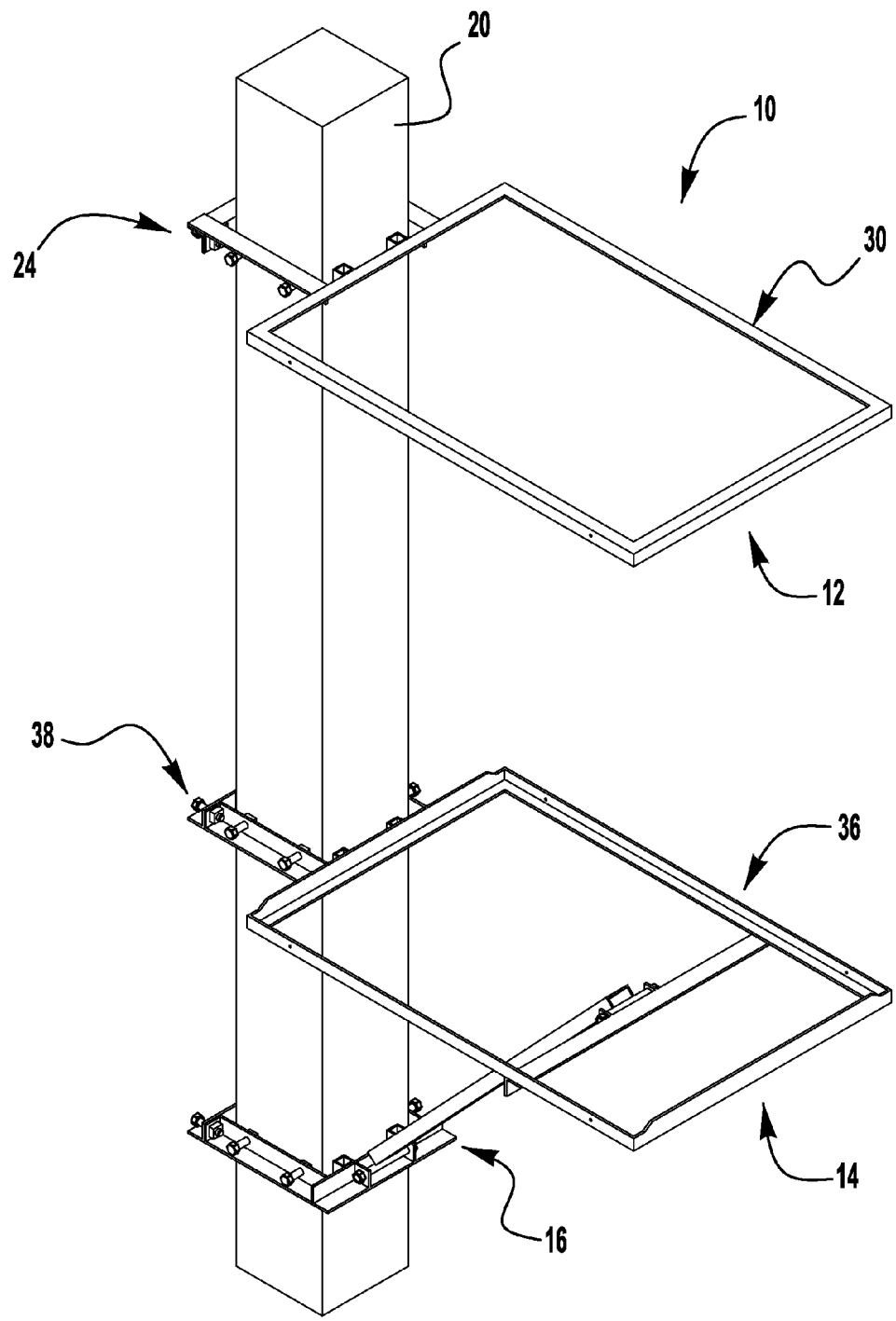
FIG. 1 is a front three-dimensional view of the electronics cabinet bracket system, in accordance with the present invention.

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

Figure 2:
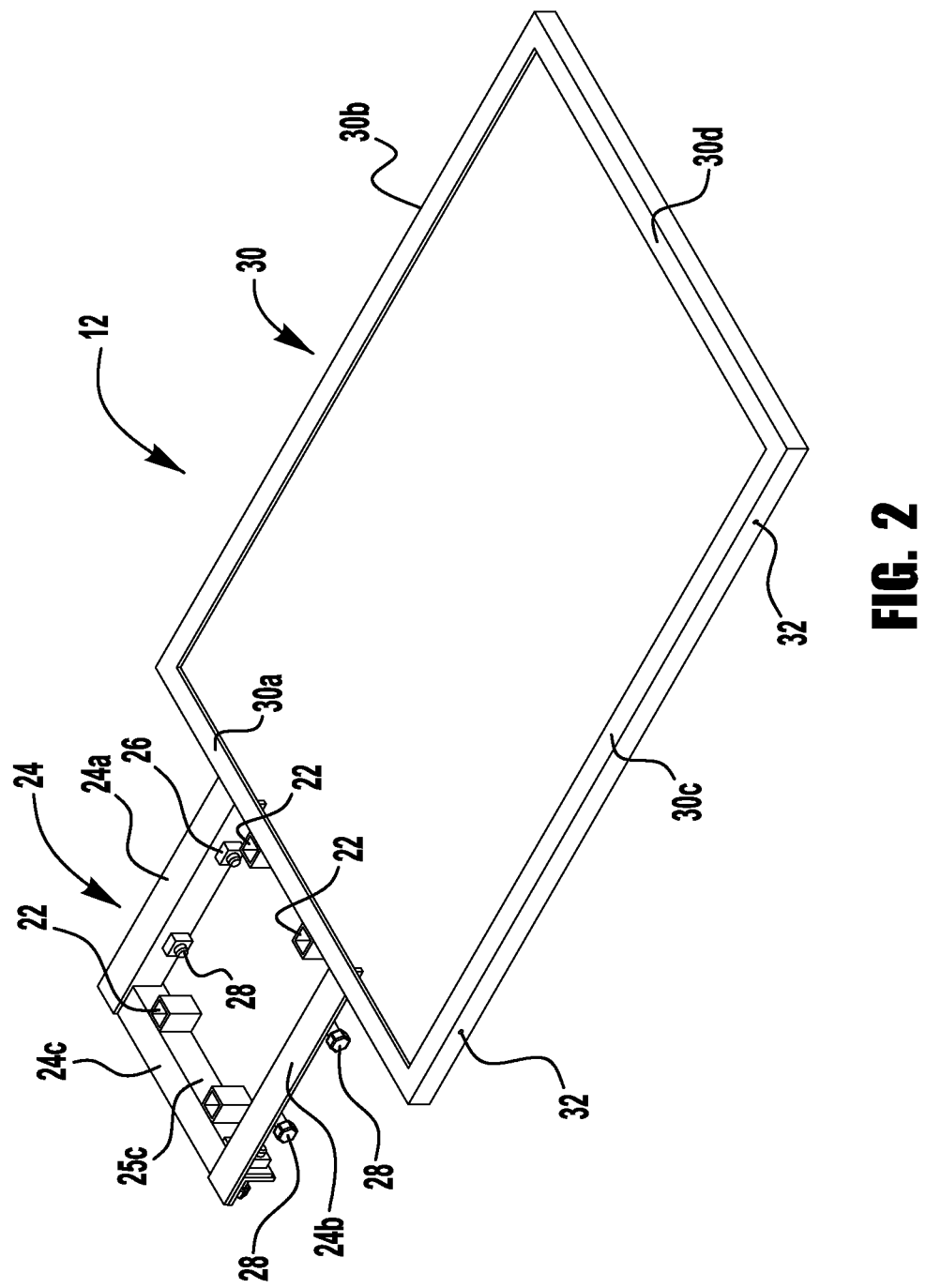
FIG. 2 is a front three-dimensional view of the upper cabinet bracket of the electronics cabinet bracket system, in accordance with the present invention.

The present invention is directed to an electronics cabinet bracket system 10 (hereafter "bracket system"), as shown in FIG. 1. The electronics cabinet bracket system 10 is designed to hold and support an electronics cabinet (as seen in FIG. 2) for housing computer related electronics, such as is used in a large box store. The advantages of the present invention include the ability to conveniently and safely secure cumbersome electronics cabinets that would otherwise cause clutter, or in a commercial setting, impede a shopper's ability to safely walk down an aisle.

Figure 4:
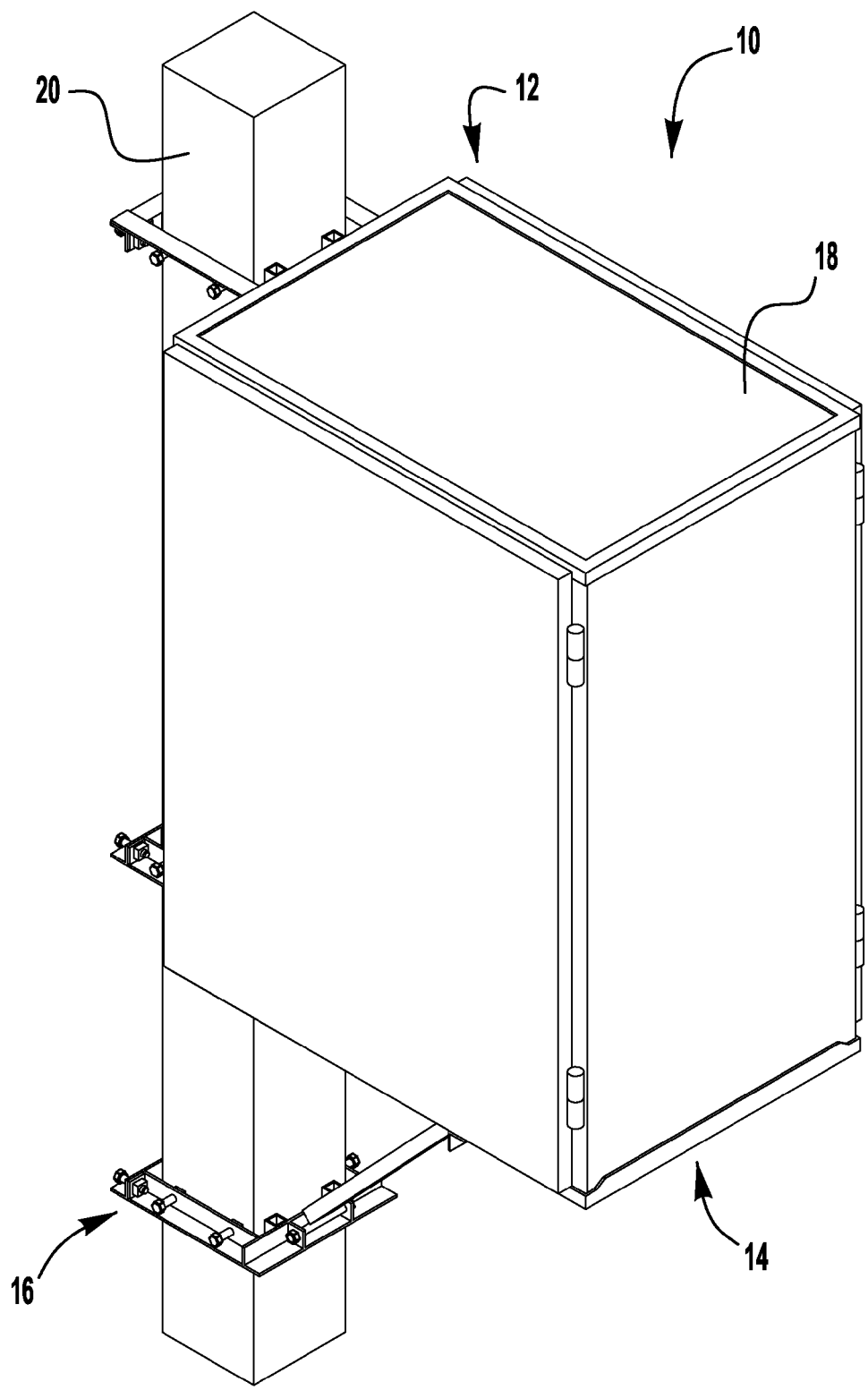
FIG. 4 is a front three-dimensional view of the electronics cabinet bracket system, as shown in FIG. 1, in use with an electronics cabinet, in accordance with the present invention.

FIG. 1 is a front, three dimensional view of cabinet bracket system 10 secured about a pillar or column 20 in accordance with the present invention. The pillar or column 20 is illustrated as having a square shaped cross-section. However, it is within the terms of the present invention for the bracket system 10 to be utilized with a pillar or column that is rectangular, or circular in cross-section. The electronics cabinet bracket system 10 comprises an upper cabinet bracket 12, a lower cabinet bracket 14, and a bottom support bracket 16. In general terms, a cabinet 18, as seen in FIG. 4, is supported upon lower cabinet bracket 14 and is secured in place with the upper cabinet bracket 12. Bottom support bracket 16 is secured to lower cabinet bracket 14 so as to prevent the lower bracket 14 from moving on the column 20 when the cabinet 18 is mounted onto the cabinet 14.

FIG. 2 illustrates a detailed view of the upper cabinet bracket 12. The upper bracket 12 includes an upper outer bracket 30 which secures the cabinet 18 to the lower bracket 14 and an upper rear bracket 24 that is mounted to the upper outer bracket 30 and is movably attached to a pillar or column 20 to secure the upper cabinet bracket 12 in a desired location above lower cabinet bracket 14. Upper rear bracket 24 is generally U-shaped and includes two side arms 24a and 24b and a rear arm 24c. Side arms 24a and 24b can have a plurality of pinch bolts 28 threadedly mounted therethrough, such as with square nuts 26 that can be welded in place. The bolts 28 can be turned towards the enclosed space between the side arms 24a and 24b and rear arm 24c to tighten against a column disposed within the upper rear bracket 24. Exemplary dimensions of square nuts 26 may be ¾"×¾" and the pinch bolts 28 can have with exemplary threads of ½". Pinch bolts 28 may be tightened and loosened to accommodate columns of varying widths. There are two spacing tubes 22 attached to the vertically disposed wall 25c of rear arm 24c to act as spacers to allow electrical wires to run between the upper rear bracket 24 and the pillar or column 20. Exemplary dimensions of spacing tubes 22 may include 1"×1"×⅛".

Upper rear bracket 24 is welded to upper outer bracket 30, which acts to fit over and secure a cabinet 18, as seen in FIG. 4. There are two spacing tubes 22 attached to the rear wall 30a of upper outer bracket 30 to allow electrical wires to run between the upper outer bracket 30 and the pillar or column 20. Upper outer bracket 30 has a rear wall 30a, two side walls 30b, 30c, and a front wall 30d. Preferably, rear wall 30a, two side walls 30b, 30c, and a front wall 30d are constructed of angle irons with exemplary dimensions of 1"×1"×³⁄₁₆". A plurality of holes 32 can be formed through the vertical extending sides of the angle irons of side walls 30b and 30c with exemplary dimensions of ³⁄₁₆" to accommodate screws to secure the cabinet 18 to upper outer bracket 30.

The interior facing sides of the vertical extending sides of walls 30a, 30b, 30c, and 30d are placed against the sides of the cabinet 18, while interior facing sides of the horizontal extending portions of walls 30a, 30b, 30c, and 30d are placed against the top of the cabinet 18.

Figure 3:
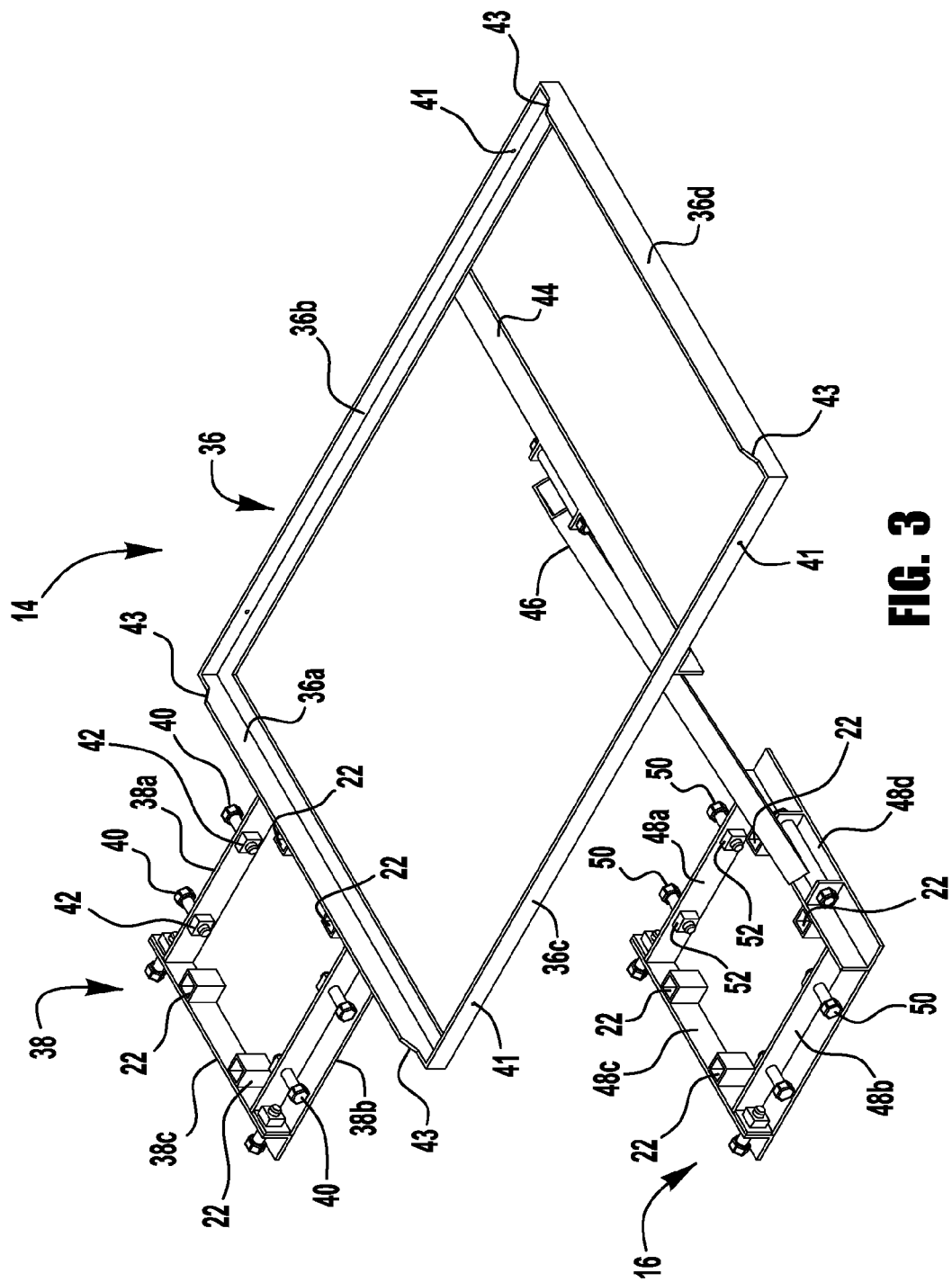
FIG. 3 is a front three-dimensional view of the lower cabinet bracket and bottom support bracket of the electronics cabinet bracket system, in accordance with the present invention.

FIG. 3 illustrates a detailed view of the lower cabinet bracket 14 and the bottom support bracket 16. The lower cabinet bracket 14 includes a lower outer bracket 36 which supports the cabinet 18 and a lower rear bracket 38 that is mounted to the lower outer bracket 36 and is movably attached to a pillar or column 20 to secure the lower cabinet bracket 14 in a desired location below upper cabinet bracket 12. Lower rear bracket 36 is generally U-shaped and includes two side arms 38a and 38b and a rear arm 38c. Side arms 38a and 38b can have a plurality of pinch bolts 40 threadedly mounted therethrough, such as with square nuts 42 that can be welded in place. The bolts 40 can be turned towards the enclosed space between the side arms 38a and 38b and rear arm 38c to tighten against a column disposed within the lower rear bracket 38. Exemplary dimensions of square nuts 42 may be ¾"×¾" and the pinch bolts 40 can have with exemplary threads of ½". Pinch bolts 40 may be tightened and loosened to accommodate columns of varying widths. There are two spacing tubes 22 attached to the rear arm 38c to act as spacers to allow electrical wires to run between the lower rear bracket 38 and the pillar or column 20. Exemplary dimensions of spacing tubes 22 may include 1"×1"×⅛".

Lower rear bracket 38 is welded to lower outer bracket 36, which acts to fit under and support a cabinet 18, as seen in FIG. 4. There are two spacing tubes 22 attached to the rear wall 36a of lower outer bracket 36 to act as spacers to allow electrical wires to run between the lower outer bracket 36 and the pillar or column 20. Lower outer bracket 36 has a rear wall 36a, two side walls 36b, 36c, and a front wall 36d. Preferably, rear wall 36a, two side walls 36b, 36c, and front wall 36d are constructed of angle irons with exemplary dimensions of 1"×1"×³⁄₁₆". A plurality of holes 41 can be formed through the vertical extending sides of the angle irons of side walls 36b and 36c with exemplary dimensions of ³⁄₁₆" to accommodate screws to secure the cabinet 18 to lower outer bracket 36.

The interior facing sides of the vertical extending sides of walls 36a, 36b, 36c, and 36d are placed against the sides of the cabinet 18, while interior facing sides of the horizontal extending portions of walls 36a, 36b, 36c, and 36d are placed under the bottom of the cabinet 18. There are relief cuts 43, such as 1", about the corners of the lower outer bracket 36, designed to accommodate hinges of the swinging doors of cabinet 18. Relief cuts 43 may be of any desired size.

The lower outer bracket 36 includes a support brace 44 which is securely mounted, such as by welding, to side walls 36b and 36c to further act as a support to the cabinet 18. Support brace 44 is typically an angle iron with exemplary dimensions such as 1.5"×1.5"×³⁄₁₆" and 22.5" long. Attached to support brace 44 is a strut brace 46 which can be pivotally secured, such as by bolting, to provide further support for cabinet 18. Strut brace 46 is designed to provide additional support for the lower cabinet bracket 14. While the preferred angle at which the strut brace 46 is attached to the support brace 44 is between about 45° and 75°, it is within the terms of the invention to use any desired angle.

Bottom support bracket 16 is generally U-shaped and includes two side arms 48a and 48b, a rear arm 48c and a front arm 48d. Side arms 48a and 48b can have a plurality of pinch bolts 50 threadedly mounted therethrough, such as with square nuts 52 that can be welded in place. The bolts 50 can be turned towards the enclosed space between the side arms 48a and 48b, rear arm 38c and front arm 48d to tighten against a column disposed within the bottom support bracket 16. Exemplary dimensions of square nuts 52 may be ¾"×¾" and the pinch bolts 50 can have with exemplary threads of ½". Pinch bolts 50 may be tightened and loosened to accommodate columns of varying widths. There are two spacing tubes 22 attached to the rear arm 48c and two spacing tubes 22 attached to the front arm 48d to allow electrical wires to run between the bottom support bracket 16 and the pillar or column 20. Exemplary dimensions of spacing tubes 22 may include 1"×1"×⅛".

Front arm 48d of bottom support bracket 16 is attached to support brace 44 by the strut brace 46. The strut brace 46 is preferably pivotally secured to the front arm 48d of bottom support bracket 16, such as by bolting, to provide further support for cabinet 18 through its support for the lower cabinet bracket 14. While the preferred angle at which the strut brace 46 is attached to the front arm 48d is between about 45° and 75°, it is within the terms of the invention to use any desired angle.

FIG. 4 illustrates the bracket system 10 in use with an electronics cabinet 18.

The procedure for mounting the cabinet 18 to the column 20 using the bracket system 10 is as follows. The lower cabinet bracket 14 is mounted the to the column 20, by threadedly mounting pinch bolts 40 through the lower cabinet bracket, and tightening the bolts against the column to secure the lower cabinet bracket to the column.

The bottom support bracket 16 can then be mounted to the column 20 by threadedly mounting pinch bolts 50 through the bottom support bracket, and tightening the bolts against the column to secure the bottom support bracket to the column 20. The strut brace 46 is secured between the bottom support bracket 16 and the support brace 44 of the lower outer bracket 36 to provide additional support for the lower cabinet bracket 14.

Next, the bottom of the electronics cabinet 18 is disposed on the lower cabinet bracket 14.

Continuing, the upper cabinet bracket 12 is mounted to the column 20 at a location above the top of the electronics cabinet 18. Then, the upper cabinet bracket 14 is lowered to engage the top surface of the electronics cabinet 18. The upper cabinet bracket 14 is secured by threadedly mounting pinch bolts 28 through the upper cabinet bracket, and tightening the bolts against the column to secure the upper cabinet bracket to the column.

The bottom support bracket 16 is mounted to the column 20 by threadedly mounting pinch bolts 50 through the bottom support bracket, and tightening the bolts against the column to secure the bottom support bracket to the column 20. The strut brace 46 is secured between the bottom support bracket 16 and the support brace 44 of the lower outer bracket 36 to provide additional support for the lower cabinet bracket 14.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. A cabinet bracket system secured to a column adapted for supporting an electronics cabinet, comprising:
   a lower cabinet bracket adapted to be disposed against a bottom of the electronics cabinet;
   an upper cabinet bracket adapted to be disposed against a top of the electronics cabinet;
   a bottom support bracket secured to the lower cabinet bracket so as to prevent lower bracket from moving on the column when the electronics cabinet is mounted onto the lower cabinet bracket; and
   wherein the upper bracket includes:
      an upper outer bracket adapted for securing the electronics cabinet to the lower bracket; and
      an upper rear bracket movably attached to the column to secure the upper cabinet bracket in a desired location above the lower cabinet bracket;
   the upper rear bracket is mounted to the upper outer bracket and is generally U-shaped; and
      wherein the upper rear bracket includes:
         two side arms and a rear arm; and
         the side arms have a plurality of pinch bolts threadedly mounted therethrough to tighten against the column disposed within the upper rear bracket.

2. The cabinet bracket system of claim 1 wherein the upper rear bracket includes one or more spacing tubes attached to the rear arm to act as conduits for electrical wires.

3. The cabinet bracket system of claim 1 wherein:
   the upper rear bracket is secured to upper outer bracket; and
   the upper outer bracket has a rear wall, two side walls, and a front wall adapted to be placed against both sides of electronics cabinet and against the top of electronics cabinet.

4. The cabinet bracket system of claim 1 wherein:
   the lower cabinet bracket includes a lower outer bracket adapted to support electronics cabinet and a lower rear bracket is movably attached to the column to secure the lower cabinet bracket in a desired location below upper cabinet bracket.

5. The cabinet bracket system of claim 4 wherein the lower rear bracket is generally U-shaped and mounted to the column.

6. The cabinet bracket system of claim 5 wherein the lower rear bracket includes:
   two side arms and a rear arm; and
   the two side arms of the lower rear bracket have a plurality of pinch bolts threadedly mounted therethrough to tighten against the column disposed within the lower rear bracket.

7. The cabinet bracket system of claim 6 wherein:
   the lower rear bracket is secured to lower outer bracket; and
   the lower outer bracket has a rear wall, two side walls, and a front wall adapted to be placed against both sides of electronics cabinet and under the bottom of electronics cabinet.

8. The cabinet bracket system of claim 7 wherein:
   the lower outer bracket includes a support brace which is securely mounted to the side walls of the lower outer bracket and is adapted to support electronics cabinet.

9. The cabinet bracket system of claim 1 wherein:
   the bottom support bracket is generally rectangular in shaped and includes two side arms, a rear arm and a front arm.

10. The cabinet bracket system of claim 9 wherein:
   the two side arms of the bottom support bracket have a plurality of pinch bolts threadedly mounted therethrough being adapted to tighten against the column disposed within the support bracket.

11. The cabinet bracket system of claim 10 further including:
   a strut brace between the bottom support bracket and the lower outer bracket to provide additional support for the lower cabinet bracket.

12. The cabinet bracket system of claim 11 further including:
   the strut brace between the bottom support bracket and the lower outer bracket to provide additional support for the lower cabinet bracket, the strut brace being pivotally secured to both the bottom support bracket and the lower outer bracket.

13. The method of supporting an electronics cabinet on a column, comprising:
   mounting a lower cabinet bracket to the column, the lower cabinet bracket having interior facing sides of a rear wall, two side walls, and a front wall;
   disposing a bottom of the electronics cabinet on the lower cabinet bracket whereby the rear wall, two side walls, and front wall are placed against sides of electronics cabinet and against the bottom of electronics cabinet;
   mounting an upper cabinet bracket to the column at a location above a top of the electronics cabinet to the column, the upper cabinet bracket having interior facing sides of a rear wall, two side walls, and a front wall;

lowering the upper cabinet bracket to engage a top surface of the electronics cabinet whereby the rear wall, two side walls, and front wall of the upper cabinet bracket are placed against the sides of electronics cabinet and against the top of electronics cabinet;

mounting a bottom support bracket to the column; and securing a strut brace between the bottom support bracket and the lower cabinet bracket to provide additional support for the lower cabinet bracket.

14. The method of claim 13, comprising:

threadedly mounting pinch bolts through the lower cabinet bracket; and tightening the bolts against the column to secure the lower cabinet bracket to the column.

15. The method of claim 14, comprising:

threadedly mounting pinch bolts through the upper cabinet bracket; and tightening the bolts through the upper cabinet bracket against the column to secure the upper cabinet bracket to the column.

16. The method of claim 15, comprising:

threadedly mounting pinch bolts through the bottom support bracket; and tightening the bolts through the bottom support bracket against the column to secure the bottom support bracket to the column.

17. A cabinet bracket system adapted for supporting an electronics cabinet on a column, comprising:

a lower cabinet bracket secured to the column, the lower cabinet bracket having interior facing sides of a rear wall, two side walls, and a front wall adapted to be placed against sides and bottom of an electronics cabinet;

an upper cabinet bracket secured to the column, the upper cabinet bracket having interior facing sides of a rear wall, two side walls, and a front wall adapted to be disposed above a top of the electronics cabinet on the lower cabinet bracket;

means for lowering the upper cabinet bracket to engage a top surface of the electronics cabinet whereby the rear wall, two side walls, and front wall of the upper cabinet bracket are placed against the sides of the electronics cabinet and against the top of the electronics cabinet;

a bottom support bracket secured to the column;

the bottom support bracket being secured to the lower cabinet bracket to prevent the lower cabinet bracket from moving when an electronics cabinet is mounted onto the lower cabinet bracket; and a strut brace between the bottom support bracket and the lower cabinet bracket to provide additional support for the lower cabinet bracket.

* * * * *